(12) United States Patent
Campbell et al.

(10) Patent No.: US 6,397,173 B1
(45) Date of Patent: May 28, 2002

(54) APPLICATION SPECIFIC WAVEFORM GENERATOR

(75) Inventors: Robert Owen Campbell; Chitra Seshan, both of Boulder, CO (US)

(73) Assignee: Astec International LLC, Boulder, CO (US)

( * ) Notice: Subject to any disclaimer, the term of this patent is extended or adjusted under 35 U.S.C. 154(b) by 0 days.

(21) Appl. No.: 09/304,484

(22) Filed: May 3, 1999

(51) Int. Cl.[7] .......................... G06F 9/455; G06F 17/50
(52) U.S. Cl. ............................. 703/20; 703/2
(58) Field of Search ................. 703/2, 20; 702/124, 702/66, 117, 121, 111; 714/724

(56) References Cited

U.S. PATENT DOCUMENTS

| | | |
|---|---|---|
| 4,222,108 A | 9/1980 | Braaten |
| 4,667,302 A | 5/1987 | Mackey et al. |
| 4,791,384 A | 12/1988 | Mackey et al. |
| 4,956,798 A * | 9/1990 | Dinteman ................... 708/273 |
| 5,066,909 A | 11/1991 | Firooz |
| 5,258,937 A | 11/1993 | Blackmon |
| 5,463,334 A | 10/1995 | Griffin et al. |
| 5,483,473 A | 1/1996 | Holness |
| 5,636,149 A | 6/1997 | Funck et al. |
| 5,737,342 A | 4/1998 | Ziperovich |
| 5,774,470 A | 6/1998 | Nishiya et al. |
| 5,856,983 A * | 1/1999 | Okazaki .................... 371/21.4 |
| 5,926,019 A | 7/1999 | Okumura |
| 6,124,992 A * | 9/2000 | Pham ......................... 360/46 |
| 6,130,793 A * | 10/2000 | Ohmori et al. ............... 360/53 |
| 6,173,427 B1 * | 1/2001 | Tsukagoshi ................. 714/724 |
| 6,175,459 B1 * | 1/2001 | Tomita ........................ 360/53 |

OTHER PUBLICATIONS

Free dB, "Applications of mDisk, MDK, SoftChannel and SoftDrive", downloaded from the web at www.freedb.com, 1998–1999.*

Murch et al., "Colored Noise Generation through Deterministic Chaos", IEEE Transactions on Circuits and Systems, vol. 37, Issue 5, pp. 608–613, May 1990.*

Planetee, "Article ID 7314", downloaded from the web at www.planetee.com/planetee/servlet/DisplayDocument?ArticleID=7314, Mar. 6, 2000.*

Analogic, "Analogic Corporation Introduces the AN2050A–NARB, A True Waveform Synthesizer", downloaded from the web at www.chipcenter.com/benchtop/mdp/webscan/mn00d/mn00df71.htm, Sep. 19, 2000.*

Nan–Hsiung yeh, David Wachenschwanz, and Larry Mei, "Optimal Head Design and Characterization from a Media Perspective", IEEE Transactions on Magnetics, vol. 35, No. 2, Mar. 1999, pp776–781.

Erich Valstyn, Chuck Bond, "Williams–Comstock Model with Finite–Length Transition Functions", IEEE Transactions on Magnetics, vol. 35, No. 2, Mar. 1999, pp1070–1076.

(List continued on next page.)

Primary Examiner—Russell Frejd
(74) Attorney, Agent, or Firm—Holland & Hart, LLP

(57) ABSTRACT

A waveform generator embodied in a single tester unit. The hardware includes an integrated high frequency digital/analog signal generator that allows "infinite" length of signals, integrated colored noise source with thermal asperity generator and a PC style computer including standard storage systems and connectors that are custom configurable. Optionally, additional hardware such as an oscilloscope can be integrated to further centralize all the tools required by the engineer without adding interconnectivity problems for the engineer to deal with. The software includes a generic or standard operating system, GUI (graphical user interface), and specialized interface software for easy input/definition of sequences, waveform, and drive configuration. The software also includes a mathematical model of the head/disk system used in drives, with customization options, and the ability to do monte-carlo analysis to study distributions of signal waveforms.

23 Claims, 15 Drawing Sheets

OTHER PUBLICATIONS

KnowledgeTek, Presentation materials form seminar entitled "Magnetic Recording: The Write Process Advanced Topics", 1999.

Steven E. Stupp, Michael A. Baldwinson, Peter McEwen, Thomas M. Crawford, and Charles T. Rogers, "Thermal Asperity Trends", IEEE Transactions on Magnetics, vol. 35, No. 2. Mar. 1999, pp752–757.

Younggyun Kim and Jackyun Moon, Disk Drive Readbck Signal Simulator (ReadSim), Department of Electrical and Computer Engineering University of Minnesota publication.

TEXTRONIXS. Measurement Solutions for Disk Drive Design. Nov. 1998, pp 5–12.

Dufort et al. Increasing the performance of arbitrary waveform gene using sigma–delta coding techniques. Proceedings of the International Test Conference 1998, pp. 241–248.

Rowe, M. Measure a Disk Drive's Read Channel Signals. Test & Measurement World, Aug. 1999, vol. 19, Issue 10, pp. 12–20.

* cited by examiner

APPLICATION SPECIFIC WAVEFORM GENERATOR

This invention relates generally to electronic test equipment, and more particularly to test equipment including a waveform generator that converts digital signals to analog pulses representing actual physical waveforms through the use of mathematical modeling of a physical system.

BACKGROUND OF THE INVENTION

Conventional arbitrary waveform generators such as the ones manufactured by Tektronix, Hewlett Packard, LeCroy, and others are used to output analog signals from a digital sequence. One application for arbitrary waveform generators is in the magnetic storage industry where devices include electronics operating at extremely high data rates. Engineers in the magnetic storage industry use arbitrary waveform generators to help with the design of the channel electronics (circuitry used to translate the analog signals output from the magnetic disks and read heads into digital signals). Arbitrary waveform generators made by Tektronix dominate the magnetic storage industry since they have the fastest rated signal speeds available today. The fastest speed available today in is one billion samples per second (1 Gs/s).

In disk drive systems, a transducing, or read/write, head writes incoming digital data onto a magnetic storage medium (the disks or platters). The incoming digital data serve to modulate the current in a coil of the read/write head so that a sequence of corresponding magnetic flux transitions are written as user data onto the magnetic medium in concentric tracks. The user data is typically divided into fixed lengths and stored in sectors of that length. Each sector of user data is stored with header information associated with it. In addition, servo information is also recorded on the disks to allow the drive to position the heads correctly over the data sectors. To read this recorded data (user data as well as headers and servo information), the read/write head passes over the magnetic medium and converts the magnetic transitions into pulses in an analog signal. These analog pulses are then decoded by the read channel circuitry to reproduce the digital data.

A disk drive is typically composed of a Head/Disk Assembly (HDA), and a Printed Circuit Board (PCB). The HDA includes an enclosed structure that contains the head and disk stacks, a disk drive motor, an actuator, and a preamplifier. The analog signals from the heads exit the HDA assembly and are sent through the PCB.

The PCB includes read channel circuitry on a chip that decodes the analog signals from the HDA into digital data. In order to do this, additional auxiliary signal lines (markers or gates) are also generated to keep track of whether header, servo or data fields are being read. The decoding of data has to be done very accurately in order to reproduce correctly the original digital data that was stored on the magnetic disks. The accuracy of disk drive systems is measured in error rates. An error rate of $1 \times 10^{-10}$, for example, would mean only one bit was decoded incorrectly for every $1 \times 10^{10}$ (ten billion) bits processed. Although the details described above are those embodied in a magnetic disk storage system, they are also applicable to other magnetic recording systems such as magnetic tape recording systems, communication systems, and to other systems that have a physical basis onto which data is stored.

One limitation in development and testing of the channel circuitry design is that the designer has to develop the channel circuitry before the actual drive PCB (printed circuit board) and HDA (head/disk assembly) are available, due to time-to-market constraints. Another limitation is that the channel electronics are typically manufactured by a different company than the one manufacturing the disk drive system. Since the heads and disks are not available during the initial phases of the drive channel design, the engineers in both the drive company and the chip company that manufactures the channel chip use an arbitrary waveform generator and a noise source to produce an analog signal that is meant to represent the signal from the drive.

First, the engineer creates various sequences of digital bit streams that would be typically found in the final manufactured disk drive, with the assistance of a computer. These sequences are intended to represent all the aspects of signals from the disks/heads, including but not limited to the headers and data fields associated with each sector, the servo fields that allow the drive to position the head accurately within the disk surface, as well as the various tracks in the drive which typically operate at different areal densities (bit density x track density).

Once the digital bit sequence is constructed, linear superposition of an analytical function such as a Lorenzian function is typically used to create a series of ASCII characters corresponding to voltage levels to represent the analog waveform. This series of ASCII characters is stored in a data file in the computer.

The data file is provided as an input to an arbitrary waveform generator (typically manufactured by Tektronix) through a General Purpose Interface Bus (GPIB), such as an EEE 488 standard parallel interface, or any other suitable interface. Here, the ASCII characters from the data file are converted to a corresponding analog waveform.

The analog signal output of the arbitrary waveform generator is summed with the signal from a random noise generator generating "white noise," which is random noise evenly distributed (constant amplitude) across the applicable frequency range. A white noise generator from NoiseCom is the one typically used. This final analog signal, the combination of the noise and the analog waveform is used by the engineer to study and improve the design of the read channel chip. Since the PCB which houses the read channel chip in the final disk drive system is typically not available during the design phase, the engineer uses a test fixture to house the read channel chip being designed.

At some later date in the disk drive development phase, when initial prototype HDAs are available, the analog signal from the prototype HDAs are used as a better representation. However, this usually does not represent the true distribution of signals from HDAs in production. This is because early samples of heads and disks used to make the initial HDAs are often from hand picked prototype parts from the suppliers rather than from all suppliers and manufacturing sites.

There are several shortcomings to this currently-used method of channel design. First, due to the cumbersome nature of sequence generation and input into the arbitrary waveform generator, the number of sequences of pulses that can be studied in a timely fashion are limited. Further, due to the limited amount of memory, full tracks are not easily studied since that would involve too long a sequence. Typically a single data input file, representing less than a full track length, is used through a GPIB interface to the arbitrary waveform generator.

Second, the analog pulse shape characteristics do not represent true pulse shapes of the heads and disks used in today's disk drive systems. Features that are unique to the magnetic storage system significantly affect channel error rates. Specifically, the error rates at today's and at future densities are significantly affected by the non-linear distortion associated with the write process and the distortions due to the magnetoresistive read head, that are commonly used today. None of these are taken into account when an analytical function is used to represent the analog signal output from the waveform generator.

Third, the channel design cannot be optimized for the final distribution of analog signals since, at best, a few hand-picked early head/disk combinations can be studied from the early HDAs built.

Fourth, the white noise that is used is of uniform amplitude at all frequencies. In reality, the actual noise in a disk drive system is not evenly-distributed white noise, but is instead colored noise. This means that the amplitude of the noise is correlated to or a function of the frequency. Using white noise does not allow accurate prediction of error rates since error rates at a given frequency are significantly affected by the signal-to-noise ratio and the actual noise is not accurately represented by white noise. However, no colored noise source is currently available to the engineer to represent the actual frequency distribution of the noise spectrum.

Fifth, disk noise, which depends on the physical nature of the disk, is unique to magnetic storage systems and has become the primary source of noise in such systems. This makes it one of the key determinants of error rates. It is not represented by either white noise or colored noise as described above and is a function of the actual physical disk. This disk noise is thus not well represented by white noise.

Finally, thermal asperities or irregularities are a phenomenon affecting the output signal waveforms in today's disk drive systems. This phenomenon is found when using magnetoresistive read heads in close physical proximity to the disk—and is not represented by any of the noise sources described above.

What is needed is a system that addresses these issues in an easy to use, fast configuration that allows the study of large numbers of long sequences and distribution analysis of analog signals. Automatic generation of auxiliary signal lines (markers) that are used by the read channel would also be helpful.

SUMMARY OF THE INVENTION

The present invention relates to a device for a user to employ in developing and testing disk drive channel electronics. The device includes: a processor for controlling the device, the processor including a mathematical model of a disk drive system; a user interface for the user to communicate with the device, the user interface passing data between the user and the processor; a signal generator receiving input signals from the processor relating to the mathematical model and supplying an output signal; a noise generator supplying a noise signal in response to input signals from the processor relating to the mathematical model; and a summer that sums together the output signal from the signal generator and the noise generator. The device outputs an analog signal therefrom for application to the disk drive channel electronics.

The signal generator may include two separate signal generators supplying output signals of substantially the same frequency, and the output signals may be interleaved together to create a signal at twice the frequency of the output signals. Output signals from the two signal generators may be digital. Analog output signals may be created within a first frequency range and analog output signals may be created at frequencies lower than the first frequency range by repeating portions of the digital output signals. The portions of the digital output signals may be repeated by storing the output signals in memory in a repetitive fashion. The portions of the digital output signals may be repeated by a counter that repeats the signal a given number of times based on an input signal to the counter.

The noise signal from the noise source may be colored. The amplitude and distribution of the coloration of the noise signal may be controlled by the processor based on the mathematical model. The noise signal may be colored by a programmable filter. The device may further include a power supply that supplies power to the disk drive channel electronics. The device may further include a thermal asperity generator that supplies a signal to the summer to represent noise generated by thermal asperities in the disk drive system. The thermal asperity generator may supply an analog signal.

The mathematical model may incorporate non-linear transition shift and disk noise phenomena. The mathematical model may provide a series of input signals to the signal generator and the processor may store certain patterns that are repeated often by the mathematical model in a look-up table.

The device may further include an oscilloscope circuit for analyzing signals and providing results to the processor. The user interface may include a video monitor and a pointing device. The user interface may include a Windows-based operating system. The entire device may be housed within a PC.

The present invention also relates to a device for a user to employ in developing and testing disk drive channel electronics. The device includes: a processor for controlling the device; a user interface for the user to communicate with the device, the user interface passing data between the user and the processor; a pair of signal generators receiving input signals from the processor and supplying digital output signals of substantially the same frequency; a digital interleaving circuit receptive of and interleaving together the two digital output signals to generate an interleaved output signal of approximately twice the frequency of the digital output signals; a noise generator supplying a noise signal in response to input signals from the processor; and a summer that sums together the interleaved output signal and the noise signal. The device outputs an analog signal therefrom for application to the disk drive channel electronics.

The present invention also relates to a device for a user to employ in developing and testing disk drive channel electronics. The device includes: a processor for controlling the device; a user interface for the user to communicate with the device, the user interface passing data between the user and the processor; a signal generator receiving input signals from the processor and supplying an output signal; a colored noise generator supplying a colored noise signal in response to input signals from the processor; and a summer that sums together the output signal from the signal generator and the colored noise signal. The device outputs an analog signal therefrom for application to the disk drive channel electronics.

The present invention also relates to a device for a user to employ in developing and testing disk drive channel electronics. The device includes: a processor for controlling the device; a user interface for the user to communicate with the device, the user interface passing data between the user and the processor; a signal generator receiving input signals from the processor and supplying an output signal, a noise generator supplying a noise signal in response to input signals from the processor; a thermal asperity generator that supplies a thermal asperity signal to represent noise generated by thermal asperities in the disk drive system; and a summer that sums together the output signal from the signal generator, the noise signal, and the thermal asperity signal. The device outputs an analog signal therefrom for application to the disk drive channel electronics.

The present invention relates to a testing device for supplying application-specific test signals for portions of a system under test, the test signals simulating the signals to be generated by the remainder of the system under test. The testing device includes: a processor for controlling the device, the processor including a mathematical model of a disk drive system; a user interface for the user to communicate with the device, the user interface passing data between the user and the processor; a signal generator receiving input signals from the processor based on the mathematical model and supplying an output signal; a noise generator supplying a noise signal in response to input signals from the processor based on the mathematical model; and a summer that sums together the output signal from the signal generator and the noise signal. The device outputs an analog signal therefrom for application to the portions of the system under test.

The present invention also relates to a device for a user to employ in developing and testing disk drive channel electronics. The device includes: a PC-based computer, the computer including: a video monitor; at least one input device, and a housing; and wherein the housing includes: a processor for controlling the device, the processor including a mathematical model of a disk drive system; a user interface for the user to communicate with the device, the user interface passing data between the user and the processor; a signal generator receiving input signals from the processor based on the mathematical model and supplying an output signal; a noise generator supplying a noise signal in response to input signals from the processor based on the mathematical model; and a summer that sums together the output signal from the signal generator and the noise signal; The device outputs an analog signal therefrom for application to the disk drive channel electronics.

For a fuller understanding of the nature and advantages of the present invention, reference should be made to the following detailed descriptions taken together with the accompanying figures.

DETAILED DESCRIPTION OF THE INVENTION

Figure 1:
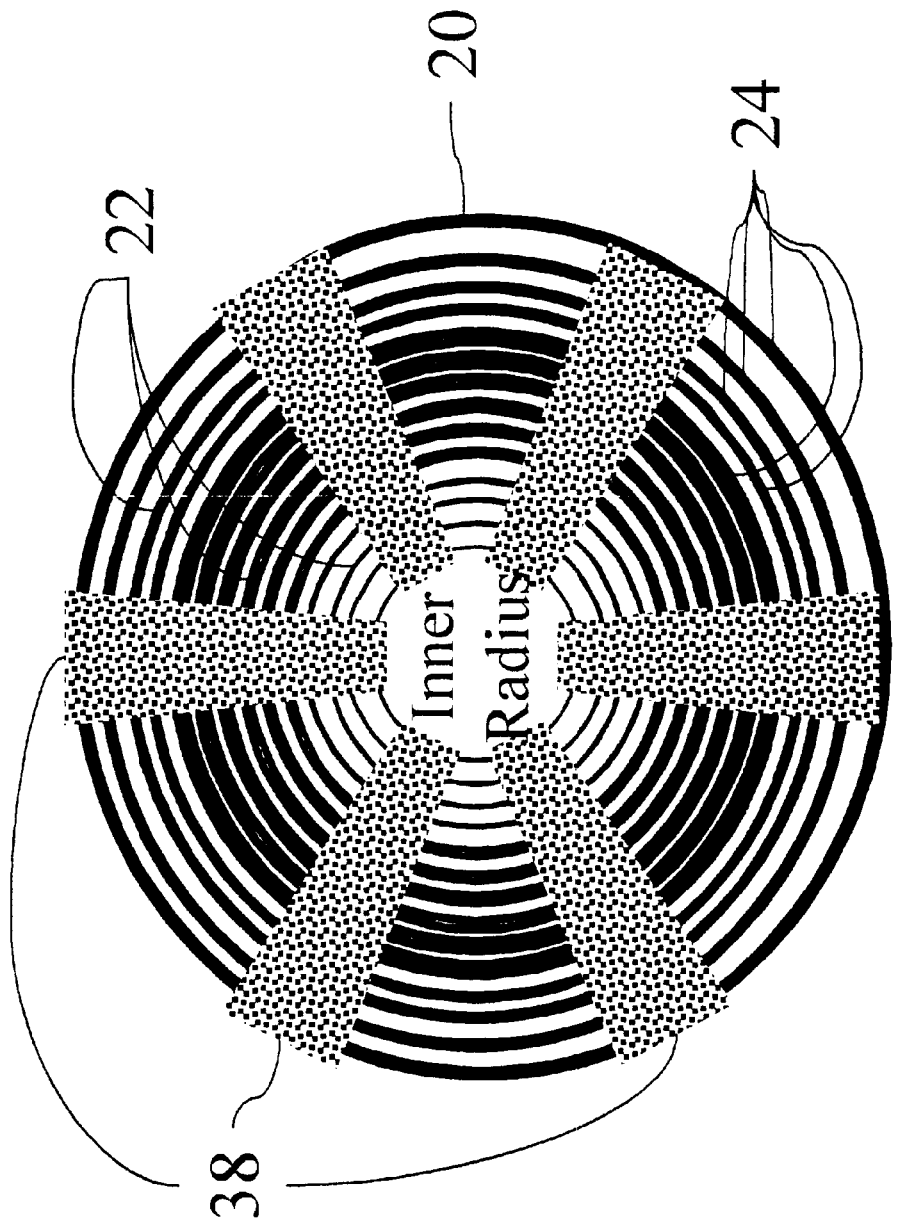
FIG. 1 is a depiction of the typical layout of data on a disk of a disk drive system.
Figure 2:
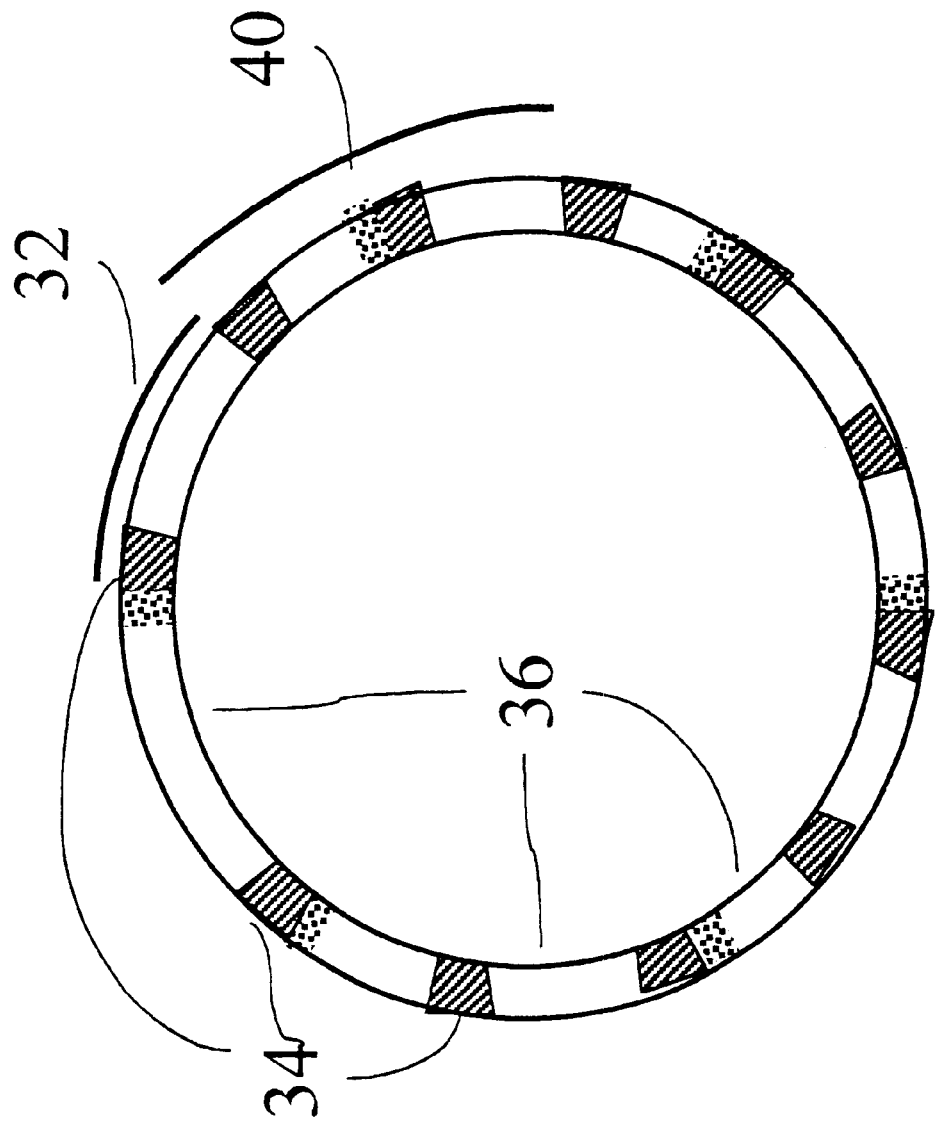
FIG. 2 is a depiction of the various sectors in a given track on the disk of FIG. 1, including header, data, and servo fields.
Figure 3:
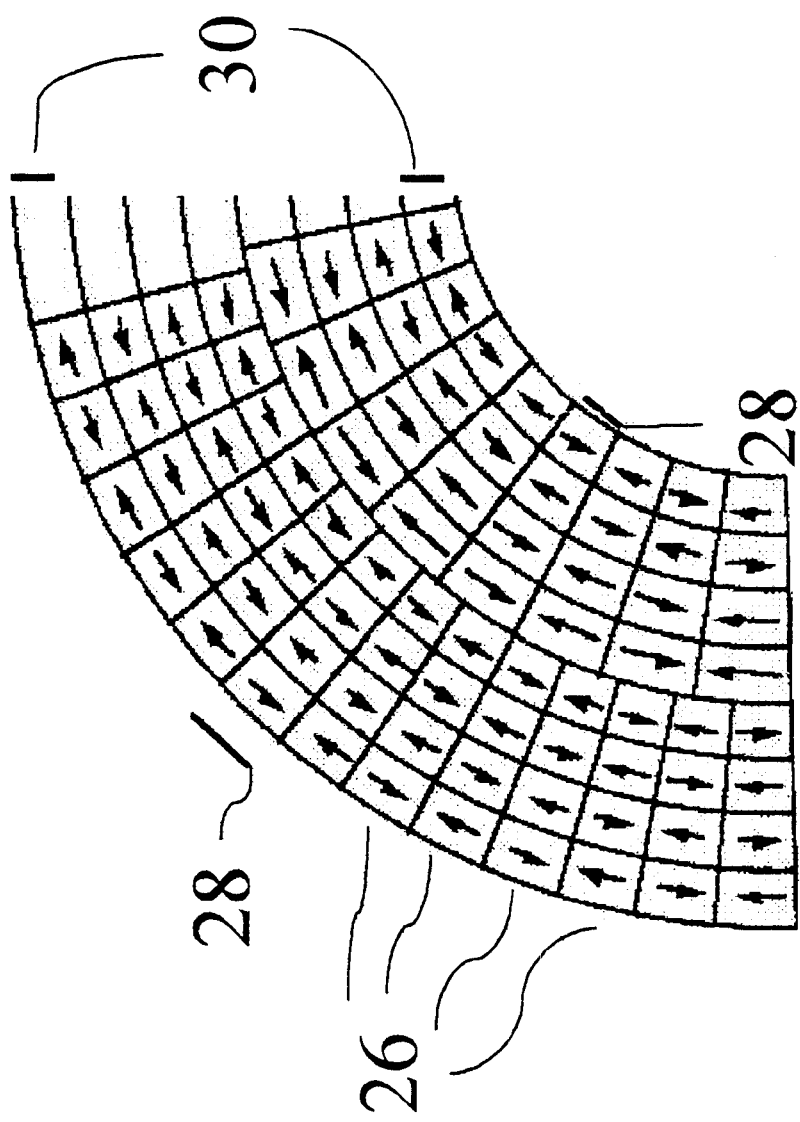
FIG. 3 is a representative depiction of adjacent bits in a portion of adjacent tracks on the disk of FIG. 1.

FIGS. 1–3 show a schematic view of the layout of data in a prior art disk drive. Each disk 20 is typically separated into several concentric zones 22. Each zone 22 includes many tracks 24. Bits 26 are sequentially arranged around the track 24. The bit density is maximum at the inner radius of each zone 22. The bit length 28 can vary zone to zone. Further, the track widths 30 can vary for the tracks 24 from the inner radius to the outer radius of the disk 20. Each track 24 is divided into an integral number of sectors 32. The number of sectors per track generally stays constant within a particular zone, but would vary from zone to zone. Each sector 32 includes a header field 34 and a data field 36.

In addition to the sectors 32, fields of servo information 38 are written onto the surfaces of the disk 20. Typically, there are a constant number of servo fields 38 on each track 24 for all tracks and they are evenly distributed spatially around the track. Therefore, a servo field 38 may fall in positions other than between two adjacent sector 32. When a servo field 38 interrupts a sector 32, a split sector 40 is formed with the header field 34 repeated after the servo field 38.

Figure 4:
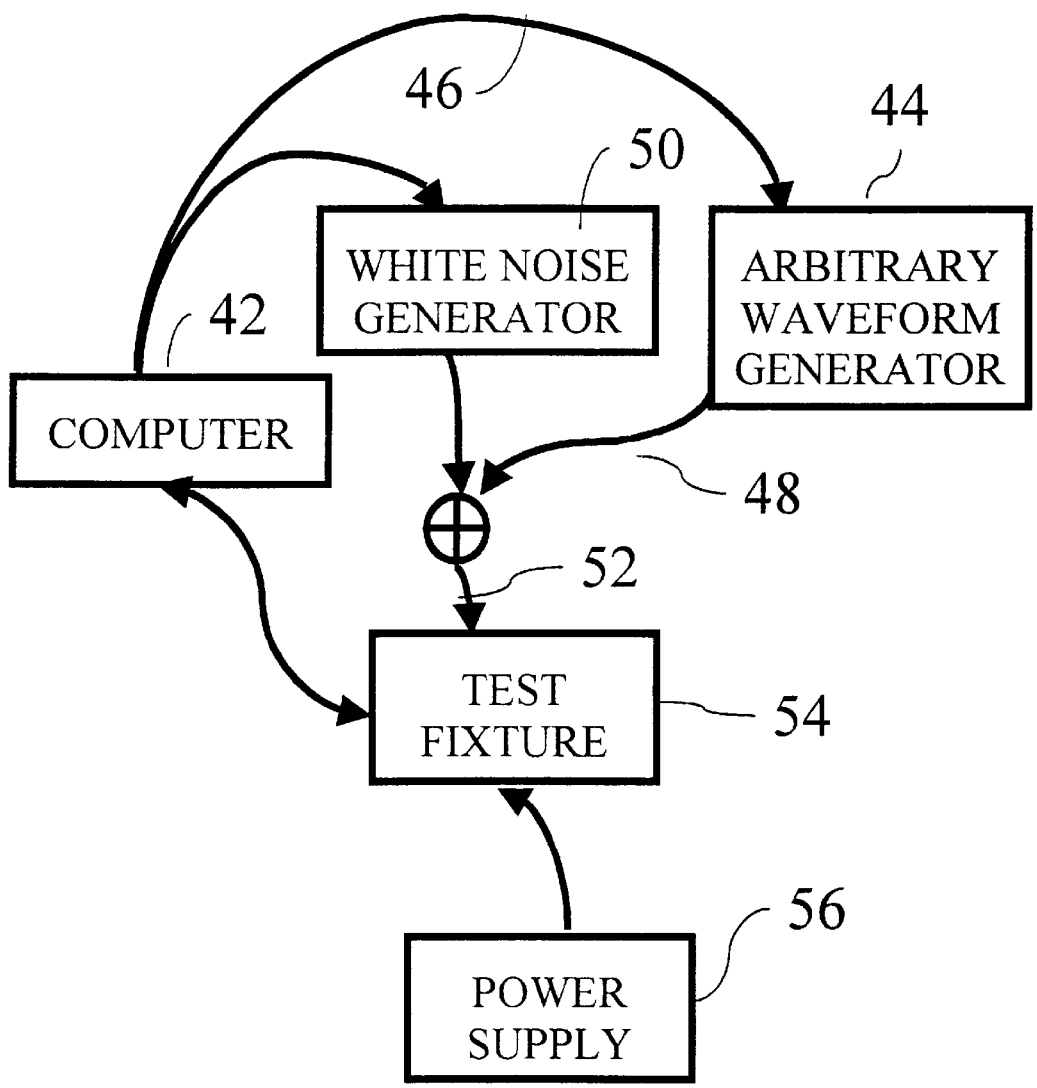
FIG. 4 is a block diagram of the typical equipment set-up for testing channel circuitry prior to the availability of heads and disks in a disk drive system.

FIG. 4 depicts the typical equipment set-up used by the channel engineer to test the channel circuitry. The sequences of digital signals from a disk data layout is created on a computer 42 for one or more radii of the disk 20. This sequence is then converted to a series of signal levels by linear superposition of an analytical function such as a Lorenzian to represent each pulse. The final sequence of signal levels is stored on a file in binary format for each data point. This file is then sent to an arbitrary waveform generator 44 through a GPIB interface 46. The waveform generator 44 takes the input file and outputs analog signals of the voltages indicated by each data point. The analog output signal 48 from the waveform generator is summed with a signal from a white noise generator 50 to create a final signal 52 that is studied in designing and testing the read channel. The read channel chip itself is housed in a test fixture 54 in the absence of the actual PCB of the disk drive system. An external power supply 56 is also attached to provide the power to the test fixture 54.

Figure 5:
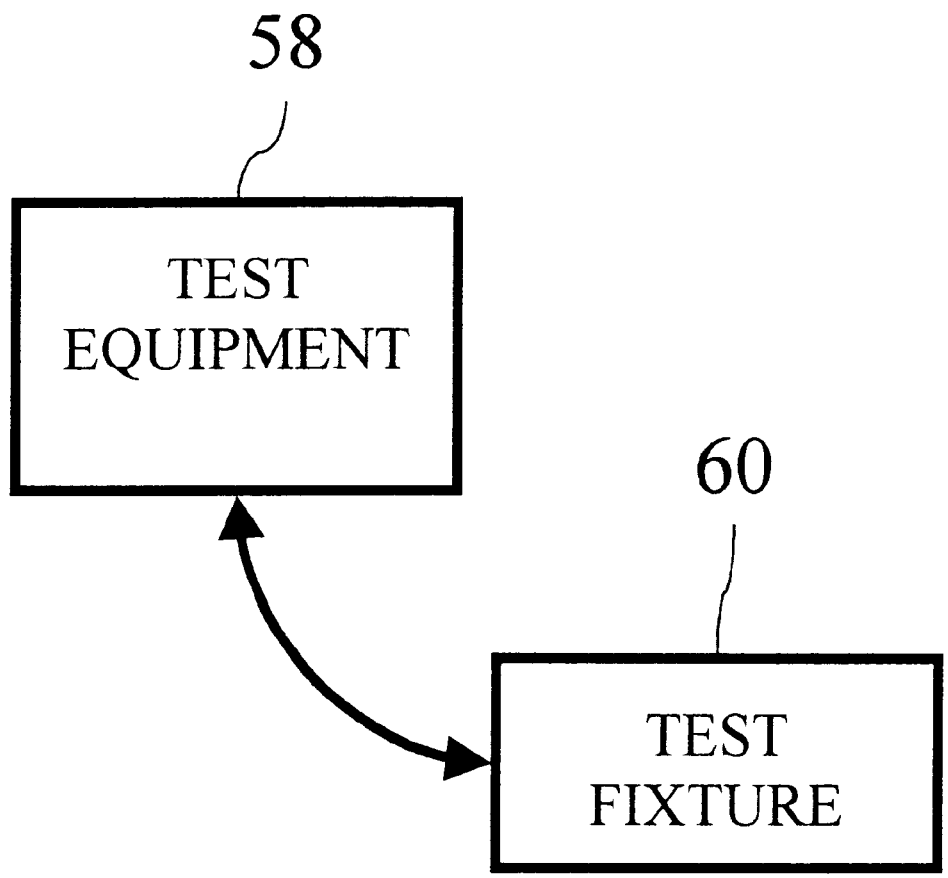
FIG. 5 is a block diagram of the equipment set-up showing the test equipment for testing channel circuitry in accordance with the present invention.

In accordance with the present invention, the multiple pieces of equipment and their connections are integrated into a single test equipment unit 58 attached to a test fixture 60, as shown in FIG. 5. This test equipment unit 58 combines the computer, the waveform generator, the noise source, and the power supply from the prior art design and adds a great deal of increased functionality. This integration simplifies the set-up process, increases portability, reduces the workspace required, and eliminates problems associated with the multiple connections including the added uncontrolled noise, additional source of failures, and set-up time (getting the right connectors properly connected to the appropriate slots with good cables).

Figure 6:
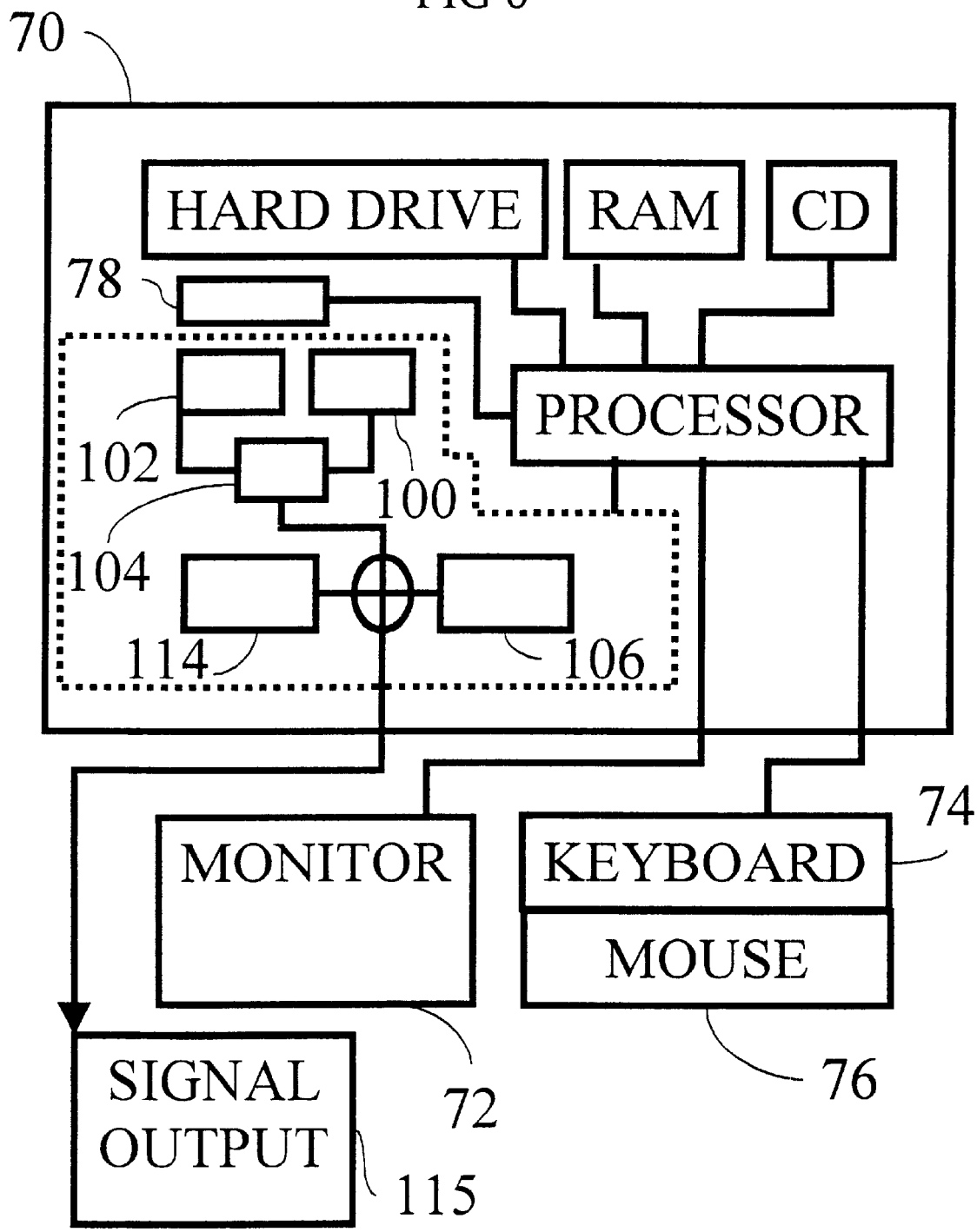
FIG. 6 is a block diagram of the hardware of the preferred embodiment of the test equipment of FIG. 5.

FIG. 6 shows a block diagram of the hardware of the preferred embodiment of the test equipment unit 58. The components are preferably (but not necessarily) enclosed within a PC-style computer housing 70 that is connected to a large-screen video monitor 72 and a full size keyboard 74 with integrated mouse pad 76. The computer 70 can be custom configured to have typical options such as parallel and serial ports, GPIB interface, modem, CD-ROM, hard drive, floppy drives, and so forth. The computer 70 is also equipped with an operating system that is familiar to the user. Typically this is a Windows-based operating system. Using a familiar hardware interface and operating system reduces the time required for the user to effectively use the test equipment unit 58. Standardized network connectivity also allows sharing of data files without learning a new network protocol.

Using a computer 70 as a base also allows for easy expansion capability. For example, additional hardware that is commonly used could be integrated into the unit. A typical such application would be adding an oscilloscope card 78. Also, additional user software could be easily incorporated. Examples would be software used for data transfer, analysis, reporting, and design. The user would not have to learn new tools and would have a single integrated workspace with all the hardware and software tools he/she needs to perform her work.

Figure 7:
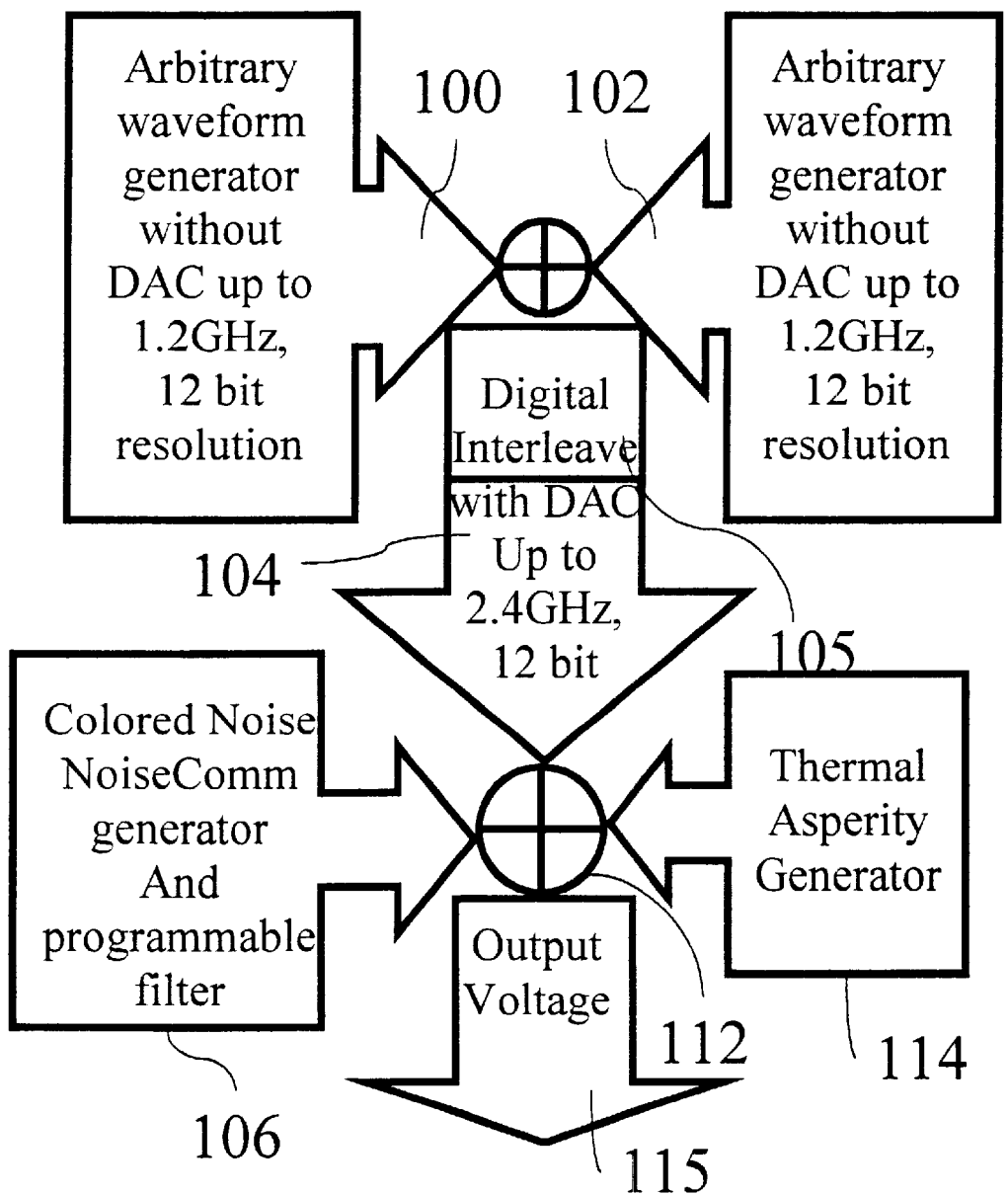
FIG. 7 is a functional flow chart of the functionality of the test equipment of FIG. 5.

FIG. 7 shows a hardware block diagram of the test equipment. Part of the additional hardware housed within the computer 70 includes a pair of arbitrary waveform generators 100 and 102. For example the arbitrary waveform generators used may be Model AWG1200 available from Chase Scientific. The signal speed of the generators 100 and 102 is as required for the application. Currently, up to 1.2 Gs/s is achieved on a single board. As shown in FIG. 6, a speed of 2.4 Gs/s can be achieved by interleaving the output signals from the two arbitrary waveform generators 100 and 102. Each generator 100 and 102 has a 12-bit resolution used for the data signal with additional bits used for the markers, and runs at a speed of up to 1.2 Gs/s. The actual speeds and number of bits are for reference only as these will change with the increasing demands for high speed data processing and with technology that allows higher speed signal generators to be built on a single card. These two waveform generators 100 and 102 need not include a Digital-to-Analog Converter (DAC) chip because the signals from the two waveform generators are digitally interleaved by a separate circuit 105 that incorporates a DAC 104 that can operate at up to 2.4 Gs/s with 12-bit resolution. Interleaving digitally before converting to an analog signal will provide a higher quality analog signal compared to interleaving two analog signal outputs from two waveform generators after each has converted to analog through respective DACs. Either implementation is possible and would work, but the preferred embodiment would use a digital interleave. While details of this circuit 105 are not yet available, analog versions of the circuit exist, and it is believed that those having skill in the art could build such a digital circuit 105.

One of the potential problems encountered is operating the generators 100 and 102 and the digital interleave circuit 105 across a broad spectrum of frequency ranges. In this example, it may be necessary to handle everything from, 1 kHz to 2.4 GHz. It would be easier and less costly to limit the range to a 1:2 ratio or better because the circuit design is simpler for a narrow frequency band, as is known in the art. For example, using this 1:2 ratio would limit the range to only be from 1.2 GHz to 2.4 GHz. The full range down to1 kHz and be produced by memory mapping or repeating data to produce the final waveform, as described below. For example, if the pattern were 1, 4, 9, 3, in the frequency range of 1.2 GHz to 2.4 GHz, the values in the DAC 104 would be 1, 4, 9, 3. However, if the frequency is in the range of 600 MHz to 1.2 GHz, the sampled values for the DAC 104 to output would be 1, 1, 4, 4, 9, 9, 3, 3. Similarly, if the frequency range were 300 MHz to 600 MHz, the values would be 1, 1, 1, 1, 4, 4, 4, 4, 9, 9, 9, 9, 3, 3, 3, 3. This pattern could continue to be progressed in this fashion to reach the lowest desired frequencies. This type of operation allows the digital interleave circuit 105 and the DAC 104 to operate within a more confined frequency range, but still mimic the lower frequency ranges. Of course, the ratio does not have to be 1:2, it could be 1:3 or any other ratio as desired.

One way of implementing this operation would be to store the repeated samples in memory as part of the data sequences to be output. Unfortunately, this would reduce the amount of memory available for lower frequency patterns. Alternatively, in order to reduce the amount of memory required, a simple counter could be set depending on the desired frequency range. For example, for the 1.2 GHz to 2.4 GHz range, the counter would be set to 0 to indicate that each data point is not repeated, or is sent $2^0$ times or once. For the 600 MHz to 1.2 GHz range, the counter would be set to 1 to indicate that each data point is repeated, or is sent $2^1$ times or twice (on the fly), and for 300 MHz to 600 MHz, the counter is set to 2 to indicate each data point is sent $2^2$ times or four times.

This could be applied not only to the digital interleave circuit 105 but also to the arbitrary waveform generators 100 and 102 to limit the frequency range of operation on each of those boards.

Another potential issue with typical arbitrary waveform generators is the limitation in the length of data sequence allowed. This is because of the limited amount of memory available. Often the implementation will allow for looping the same data to be output repeatedly. For some applications, such as the magnetic storage industry, it is more natural to process a large amount of data to represent the actual random data in a drive, rather than to loop or repeat data. Ideally, the track would be laid out (including servo fields and so forth) and processed multiple times with different random data for the data fields in the track. This means new data for each pass rather than the same old data being output repeatedly.

Using dynamic memory allows for the continuous output of signals while creating new signal patterns. This occurs within the single test unit and does not involve transferring of new data across a GPIB or other interface. This allows for the continuous output of new data, not just repeating the same old data. One way of implementing this is to use mirrored memory where one set of memory locations is allocated to storing the waveform output and one set of memory locations is allocated to be receiving the data being created and written to it by the system. The stream of input data can be automatically created by the integrated software or through external input from the user. After all the data in the first set of memory locations has been output to the arbitrary waveform generators 100 and 102, the two sets of memory locations are swapped without interrupting the output so that the data in the second set of memory locations is output to the arbitrary waveform generators 100 and 102 and the system writes new data into the first set of memory locations. This eliminates the lag time that can occur when updating the memory to a new pattern.

As seen in FIG. 7, after the analog signal is produced, it is summed with the output of a colored noise generator 106, which is embodied in another PCB card installed in the computer 70. The noise generator 106 can include the previously-described white noise source 108 manufactured by NoiseCom (located at www.noisecom.com), although others may be used as well, along with a programmable filter 110 which is manufactured by various companies including SSI, and Lucent. The programmable filter 110 allows the frequency distribution of the noise signal output from the noise generator 106 to be controlled. In effect, the noise can be custom colored for the user's application. The actual control of the programmable filter 110 is done through the software interface for ease of use. The user does not have hardware knobs to turn and tune and never has to open the housing of the computer 70.

The analog signals from the DAC 104 and the noise generator 106 are combined by a standard electrical summing circuit 112 with an analog signal from a thermal asperity generator 114. This thermal asperity generator 114, located on the same PCB as the noise generator 106, generates an analog signal that simulates the response of a magnetoresistive read head to a thermal asperity. For optimal simulation of the actual noise in a disk drive system, it is important to account for the fact that these thermal asperities exist.

Magnetoresistive sensors experience a change in resistance in the presence of a magnetic field such as the field emanating from the transitions on the disks. The change in resistance is sensed as a change in voltage by running a constant current through the sensor. The change in voltage is the analog signal that is decoded by the read channel. The resistance of the magnetoresistive sensor also changes when the sensor temperature changes. In today's disk drive systems, the head is in very close proximity to the disk (often less than 1 micro-inch), and this spacing is getting even smaller with newer designs. Physical asperities on the disk that cause the disk to physically contact the sensor can heat up the sensor by friction. This can increase the resistance of the sensor by orders of magnitude and the resistance drops as the sensor cools down. Of course, this dramatically changes the signal out put from the sensor.

This unwanted but real voltage profile is known and mathematical equations describing it can be found in the literature (particularly see Steven E. Stupp, Michael A. Baldwinson, Peter McEwen, Thomas M. Crawford, and Charles T. Rogers, "Thermal Asperity Trends", IEEE Transactions on Magnetics, Vol. 35, No. 2. March 1999, pp752–757). One way of accounting for this noise in the test equipment unit 58 would be to generate the thermal asperity voltage profile digitally in the software (before the Digital-to-Analog conversion by the DAC 104). However, this would limit the height of the voltage spike. The bit resolution of the DAC is best used for the signal amplitude range. Since the thermal asperity amplitude can be orders of magnitude higher than the data, much of the resolution would be lost if the thermal asperity is generated before the DAC. The preferred implementation is the thermal asperity generator 114 implemented in hardware and directly creating an analog signal that decays as expected. The parameters that control the frequency, magnitude, duration, and decay parameters are controlled through the software interface, again for ease of use.

Figure 8:
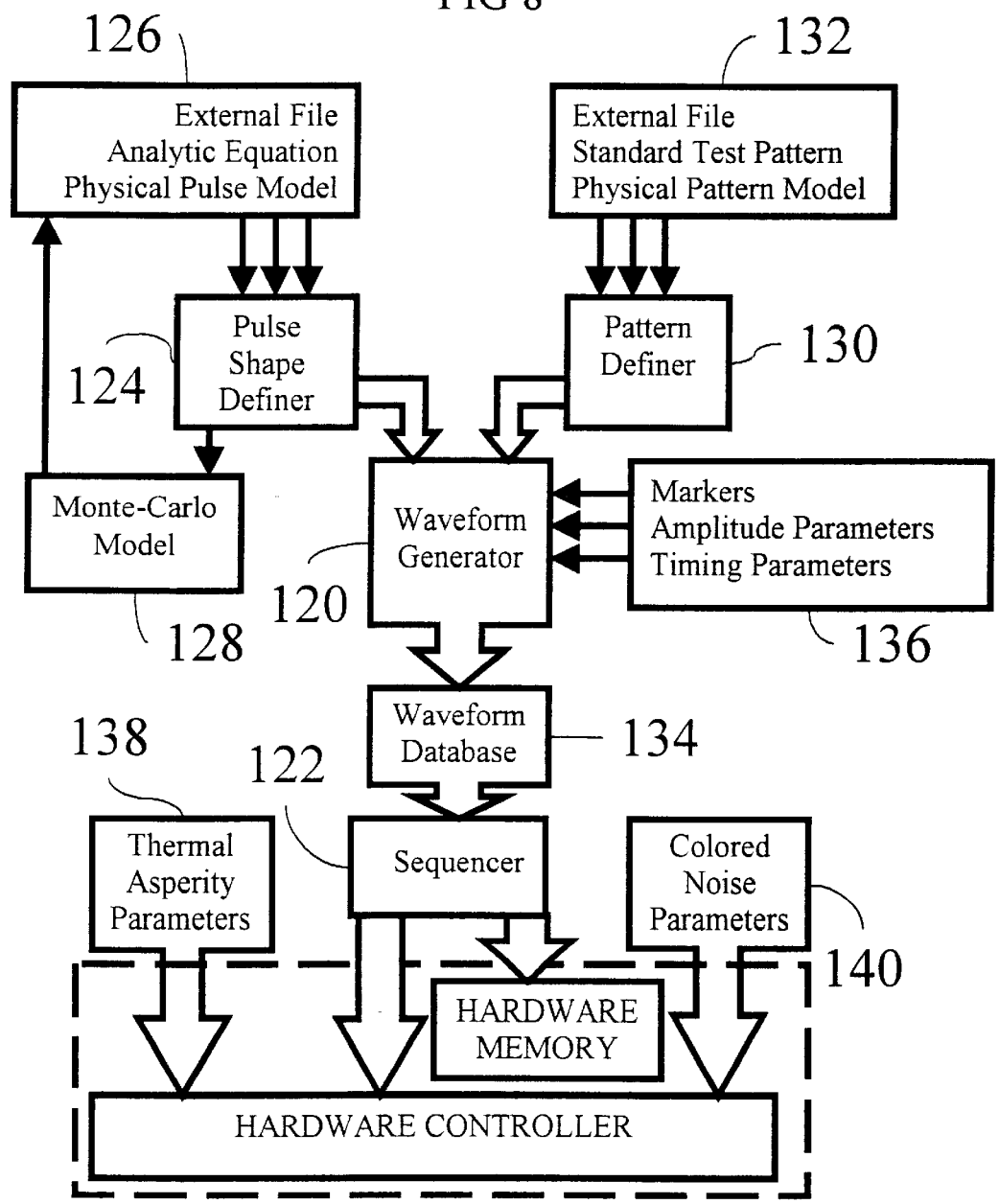
FIG. 8 is a functional flow chart of the software performed by the processor of the test equipment of FIG. 5.
Figure 9:
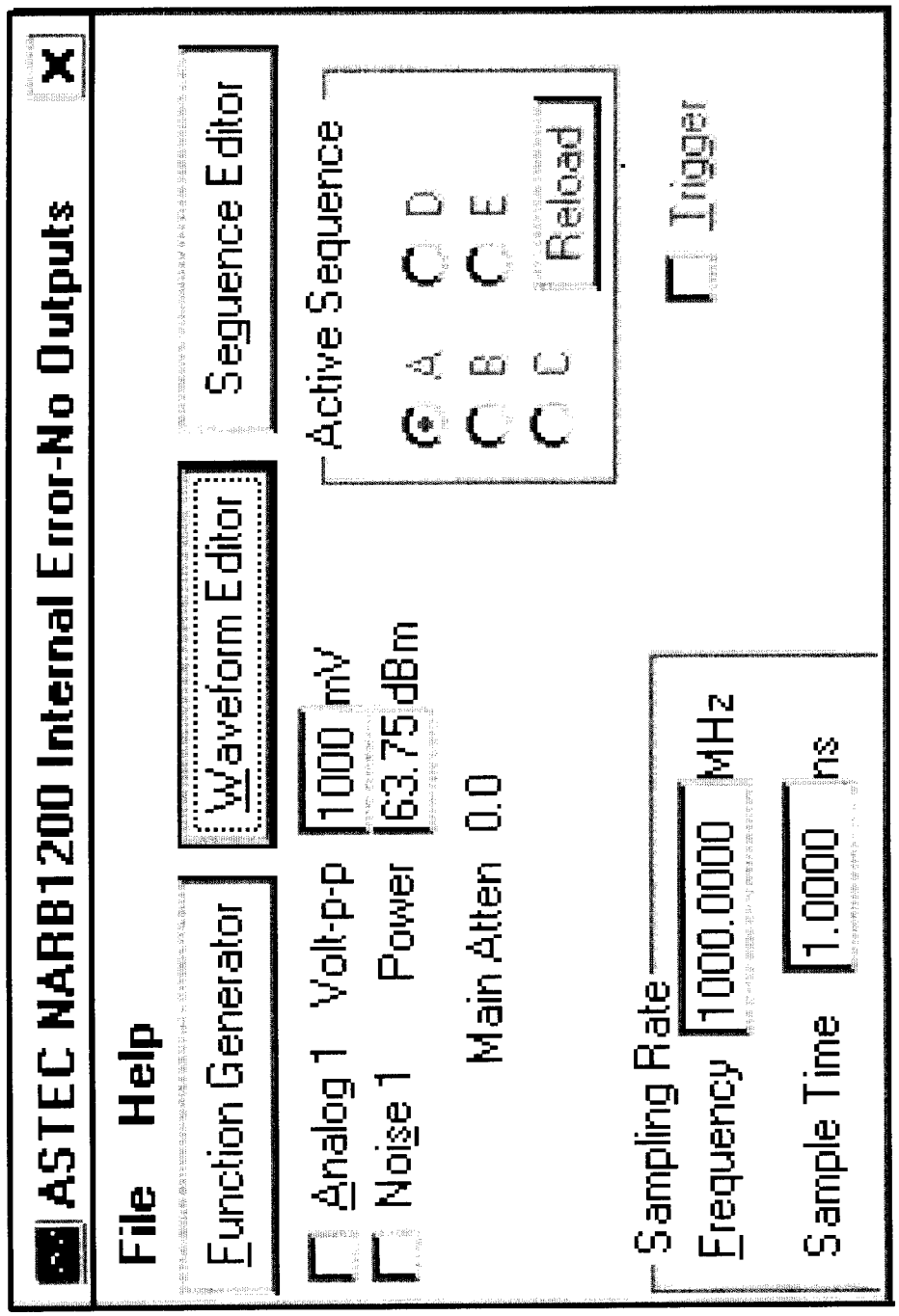
FIG. 9 shows an example of a main input screen displayed on a video monitor of the test equipment of FIG. 5.
Figure 10:
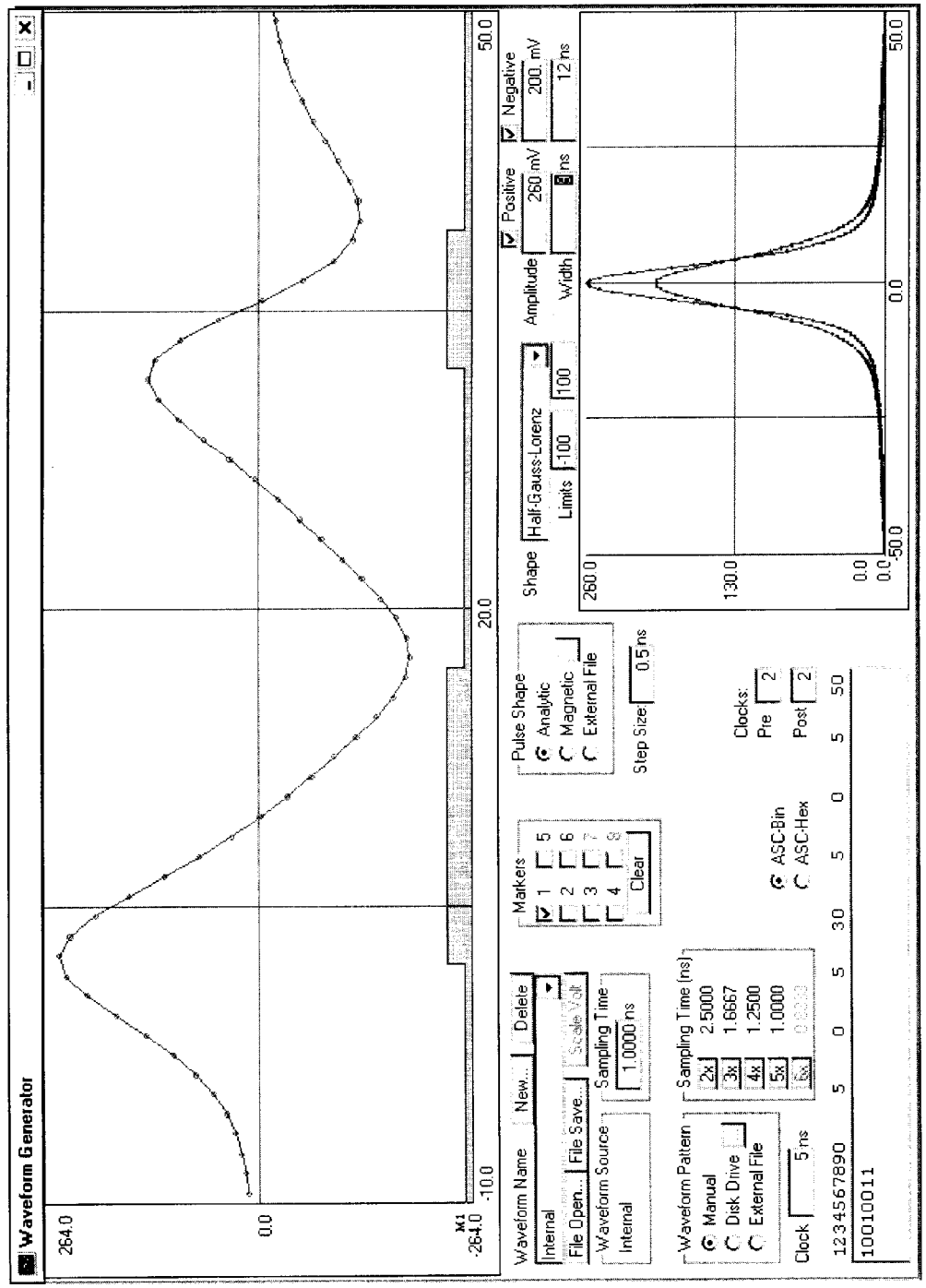
FIG. 10 shows an example of a waveform editor input screen displayed on a video monitor of the test equipment of FIG. 5.
Figure 11:
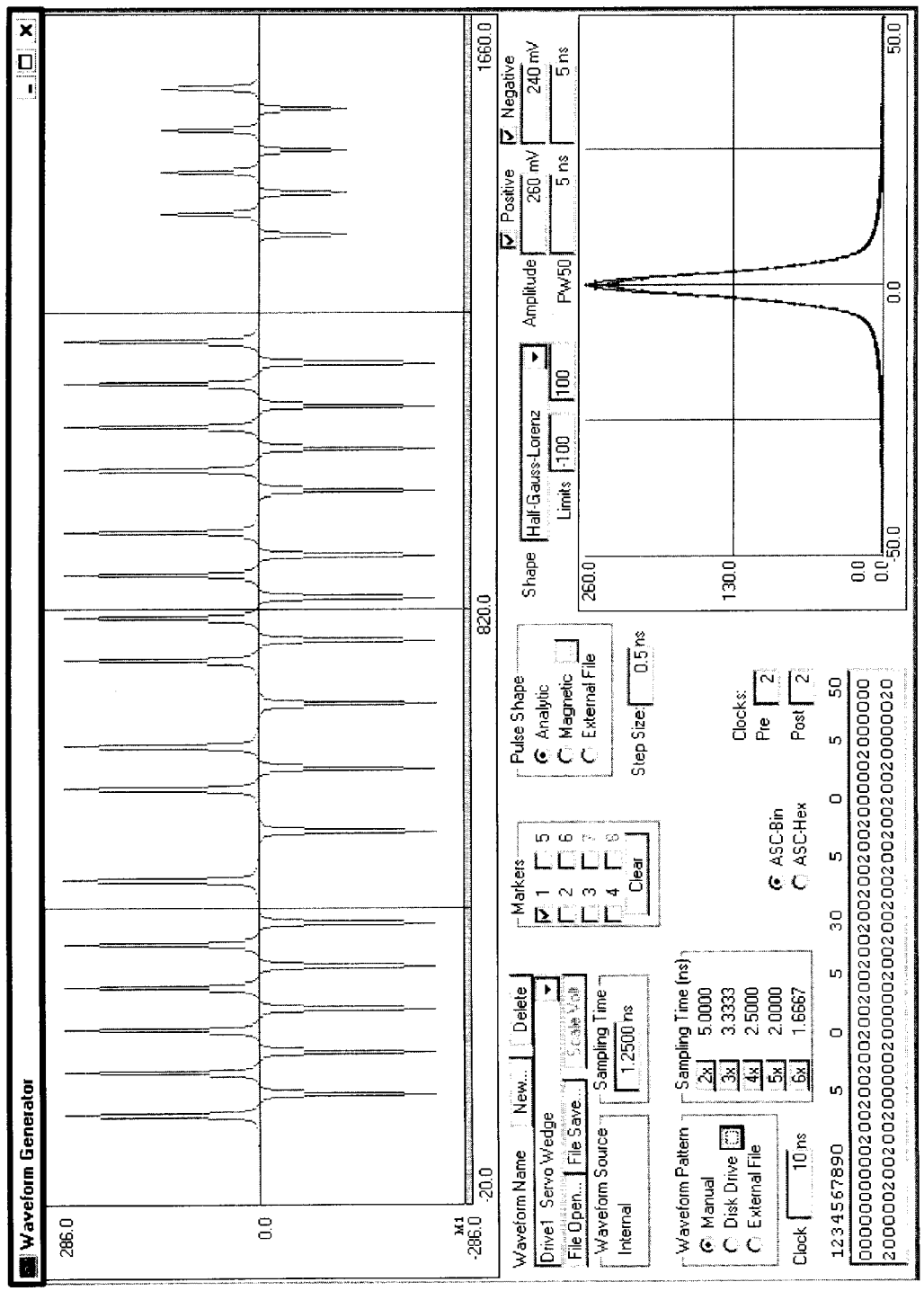
FIG. 11 shows an example of a servo field waveform displayed on a video monitor of the test equipment of FIG. 5.
Figure 12:
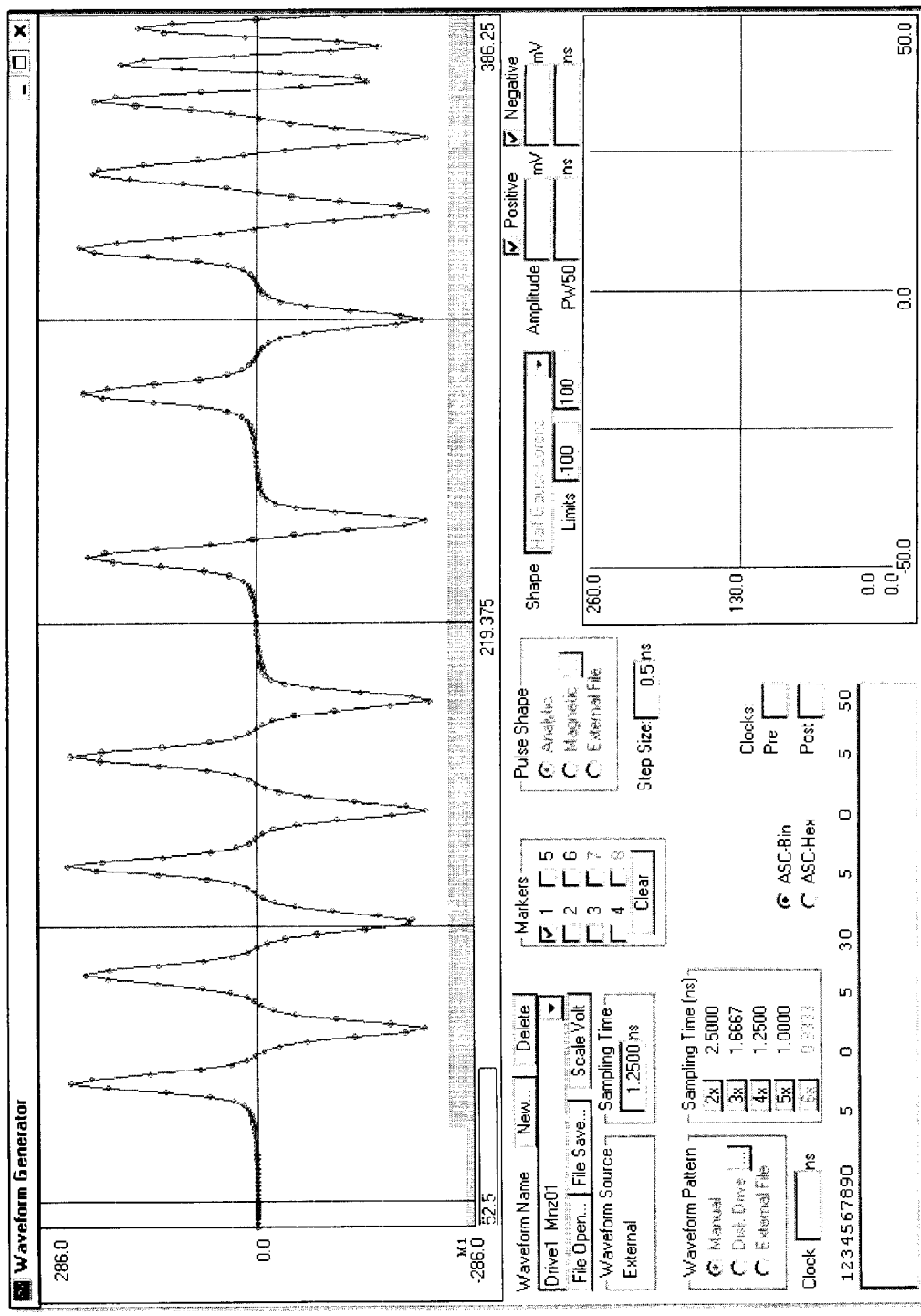
FIG. 12 shows an example of a data field waveform displayed on a video monitor of the test equipment of FIG. 5.
Figure 13:
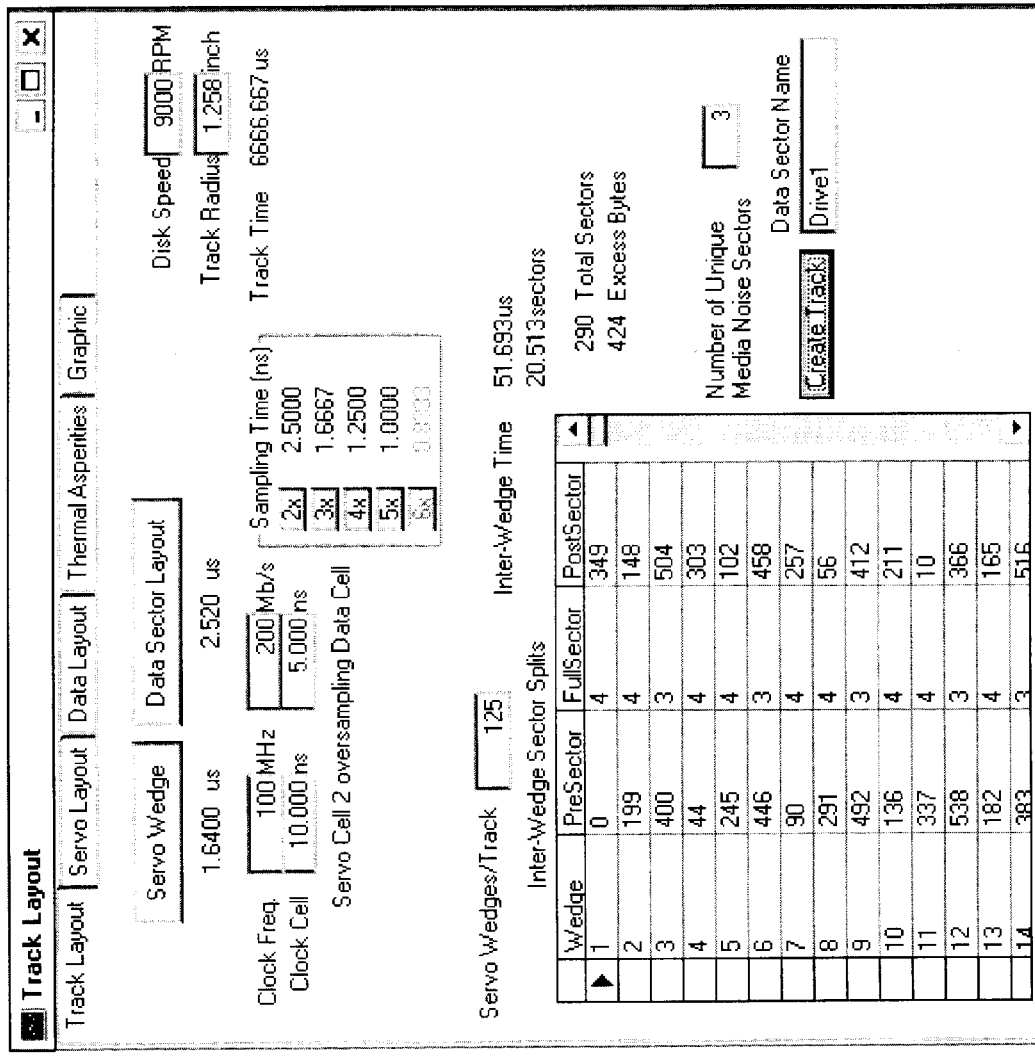
FIG. 13 shows an example of a track layout input screen displayed on a video monitor of the test equipment of FIG. 5.
Figure 14:
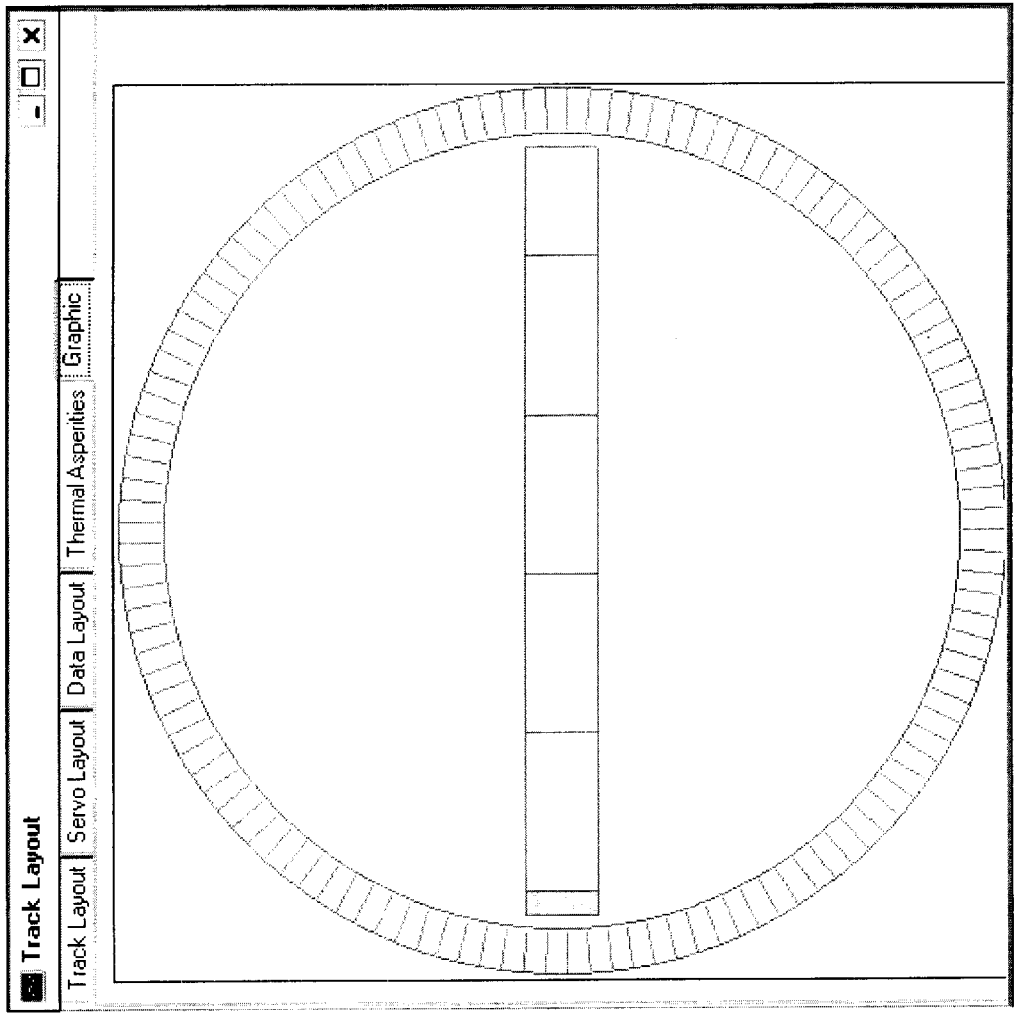
FIG. 14 shows an example of a graphical feedback screen of the track layout displayed on a video monitor of the test equipment of FIG. 5.
Figure 15:
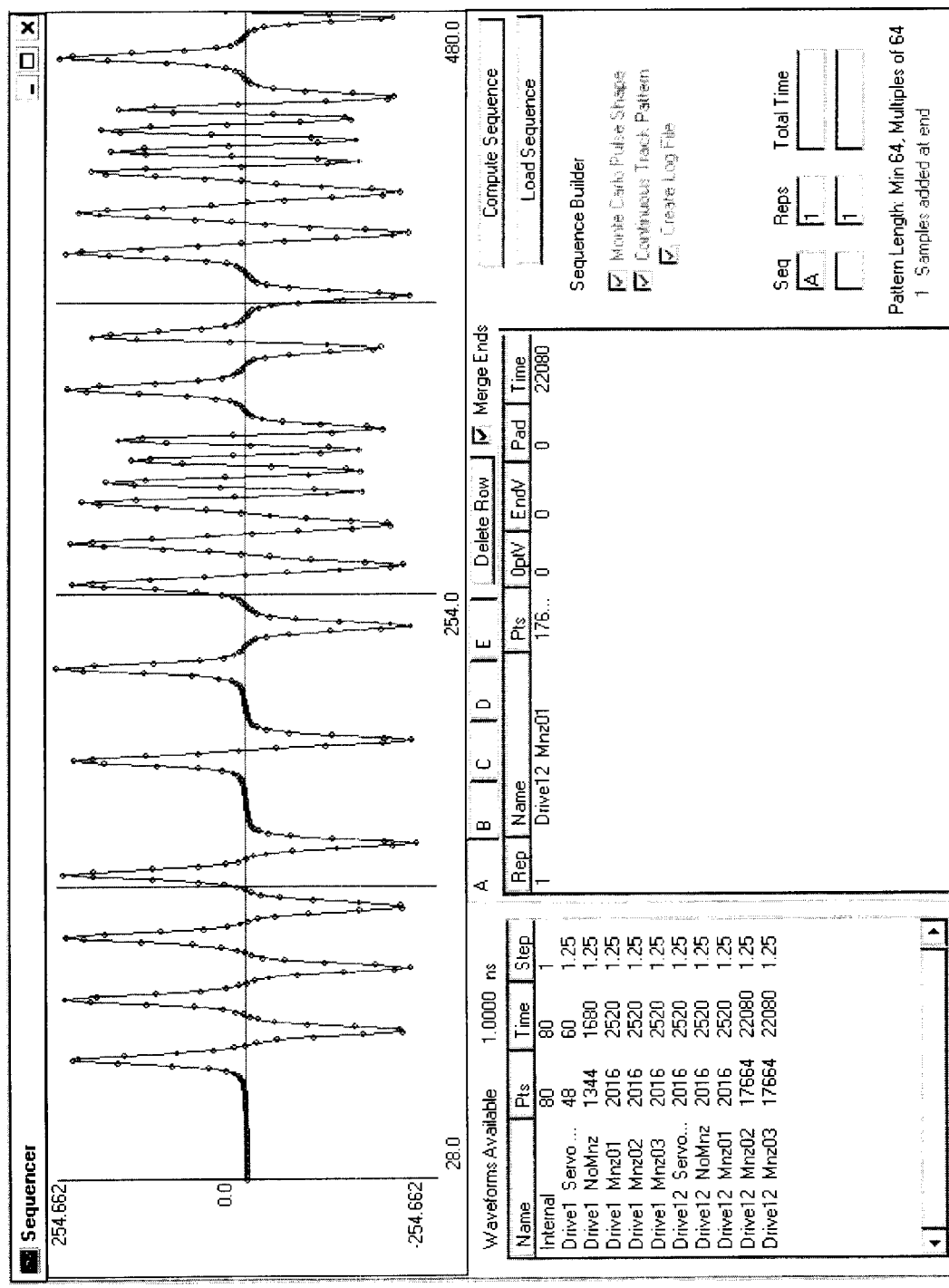
FIG. 15 shows an example of a sequence editor interface displayed on a video monitor of the test equipment of FIG. 5.

FIG. 8 is a block diagram of the specialized software implemented in the test equipment unit 58. The primary blocks of the software are the waveform generator 120 and the sequencer 122. The waveform generator 120 is used to define both the individual pulse shapes and the base sequences of pulses that define various fields that are repeated. There are several user inputs that are needed to create these waveforms.

First, to determine the pulse shapes for a pulse shape definer 124, either an external file, an analytic equation, or an integrated physical (magnetic) model 126 can be used. The positive and negative pulse amplitudes and the width of the pulse using 50% of the peak amplitude as the beginning and end of the pulse (also known as the PW50) can be separately defined, regardless of the input method used.

These pulse shapes are used as the building blocks for the pattern to be created. Pre-computed complex pulse shape base functions are created for high-speed pattern assembly. In particular, since certain short patterns are frequently repeated in a long pattern, by computing these short patterns (two to three bits) and storing them in memory, the long pattern can be assembled in much less time. This reduces the computational time by allowing a look-up table approach for non-linear pattern assembly. In general modeling practice, look-up tables are occasionally used for linear patterns, but not for non-linear patterns where pulse amplitude and position are functions of neighboring pulse positions.

The pulse shapes can be automatically varied to simulate the distributions of the physical parameters using a monte-carlo method or model 128. This is done without user intervention by setting new physical parameters in the pulse shape definer 124, based on the user inputs for the physical pulse model 126.

The waveform generator 120 also gets patterns from a pattern definer 130 that uses an external file, standard test pattern, or the integrated pattern (disk track layout) model 132 for input. A waveform database 134 stores the waveforms from the waveform generator 120 in memory as building blocks to be used in the sequencer 122. In addition to the basic pulse shapes and the pattern desired, the waveform generator 120 also requires the user to input Amplitude and Timing Parameters 136 to completely define the waveform. This is also where the markers are either user-defined or generated automatically by the integrated software.

The sequencer 122 is used to combine the various sequence fields without additional hardware memory requirement. The sequencer 122 creates the actual data points sent to the hardware for conversion from digital to analog signals. The thermal asperity parameters 138 and colored noise parameters 140 are also sent to the hardware.

Actual implementation of the software interface for all these areas are in a Windows-based graphical user interface (GUI). It is menu and mouse driven with drag-and-drop functionality wherever possible. Windows-based PCs are very common and familiar even to grade-schoolers these days. The familiar ideas of pull-down menus, on-line help, and interactive windows are used for this test equipment unit 58. This significantly reduces the training time and allows the user to do her work rather than learn how to use the equipment.

Any and all parts of the software interface can be bypassed and there is downward compatibility with the user's current file input method using their external file. Also, the user is able to create unique configurations using any or all of the features of the system.

FIGS. 9–15 show various interface screens. The look and feel and ease of use are the key components, not the details of the actual implementation. Graphical feedback is key in all aspects of the interface. Also important is the drag-and-drop features that allow the user to "drop" in external files into the pulse shapes, pattern definition, etc. The user can also zoom into areas of interest in graphical screens and physically move points around on the graphical screens. This allows for an intuitive interaction between the user and the software functions.

Throughout the program, the amount of user input is minimized for speed and ease of use. For example, each data field of random patterns need not be specified. If ten data fields are required, they will be appropriately distributed around the track with random patterns through the software.

A file management system is also included to save, retrieve and modify waveforms including the pulses, patterns, and sequences for efficient use of the user's time.

Also important are the numerous features that are specifically targeted at the magnetic storage application. Similarly, the feature set could be modified to target other specific applications, such as telecommunications. This is of particular value for applications that require modeling of a physical system to be integrated into the signal generation process.

For the magnetic storage industry, the feature set includes
the magnetic model for the pulse shape,
the asymmetric positive and negative pulses in both amplitude and pulse width (PW50) and both on and off track,
the disk drive pattern generator that allows for track layouts, servo fields, header and data fields with varying number of sectors,
automated markers,
Monte-Carlo of head/disk variables to better emulate production signal distributions,
multiple data patterns (including possible worst case pattern) automatically computed.

Data is stored magnetically in a disk drive system. The data is stored by changing the direction of magnetization in the magnetic disk by using a magnetic head that provides a sufficiently large magnetic field to change the direction of disk magnetization. The small region where the magnetization direction changes in the disk is called the transition. The data is read back using the head to detect the magnetic field emanating from the transition. The location and the shape of the transition are both important in determining the pulse shape and the error free detection of the pulses.

Key determinants of error rate in current and future drive systems include Non-linear Transition Shift (NLTS), disk noise, pulse asymmetries, and thermal asperities. These are all modeled to produce realistic signal waveforms for ease of designing drive systems. The importance of disk noise and NLTS are specifically discussed in Nan-Hsiung yeh, David Wachenschwanz, and Larry Mei, "Optimal Head Design and Characterization from a Media Perspective", IEEE Transactions on Magnetics, vol. 35, No. 2, March 1999, pp776–781. The read head model implemented is described in Erich Valstyn, Chuck Bond, "Williams-Comstock Model with Finite-Length Transition Functions", IEEE Transactions on Magnetics, vol. 35, No. 2, March 1999, pp1070–1076.

NLTS is the phenomenon that describes the non-linear effect of a transition on the location and shape of the next transition. This effect becomes magnified as the bits are placed closer together (as bit density and areal density increases). This is both a magnetic interaction effect and an electrical interaction effect.

Disk noise is unique to magnetic recording systems. It is an artifact of the physical grains in the disk. Since the transition position follows the grain boundaries, the actual shape of the transition across a track width will vary. Variation in the position and width of the transition is the source of this noise.

Unlike other noise sources such as the Johnson noise or EMI, disk noise is position and pattern dependent. If we were able to reproduce the same transition in the same physical location of the disk, there would be no variation in the transition each time we wrote it. However, since the transition would be written at a slightly different location each time, the transition shape changes since the disk grains are not the same in the new location. The physical source of this noise gives rise to its position dependence.

Disk noise is modeled in the software and is based on the physical disk parameters as indicated by the user. Default values for the physical disk parameters based on current technology are also included as a starting point. The parameters required include remnant magnetization, thickness, and coercivity.

The disk noise models incorporated are based on the modal method published by KnowledgeTek, "Advanced Write Process Seminar", 1999 and Younggyun Kim and the micro-track method published by Jackyun Moon, "Disk Drive Readbck Signal Simulator (ReadSim)", Department of Electrical and Computer Engineering University of Minnesota publication.

The micro-track non-physical model involves splitting a track (e.g. 1 urn wide) into several narrower tracks (e.g. 10 tracks each 0.1 um wide) and allowing each narrow track to vary in position. The final pulse shape is the integrated sum of the narrower tracks, which typically results in a position change, a pulse width broadening, and an amplitude reduction. The Modal model is based on physical measurements of disk noise and the creation of time varying voltage (or magnetization) waveforms that can be summed to create the resultant noise. This is a more accurate but more complex model that is used by R&D staff more often than engineering staff.

Special effort is made to make the numerical model fast as well as accurate. For example, pre-computed complex pulse shape base functions are created for high-speed pattern assembly. In particular, certain short patterns are frequently repeated in a long pattern, thus by computing these short (2–3 bit) patterns and storing them in memory, the long pattern can be assembled in much less time. This reduces the computational time by allowing a look up table approach for non-linear pattern assembly-look up tables are occasionally used for linear patterns, but not for non-linear patterns where pulse amplitude and position are functions of neighboring pulse positions.

Additionally, to speed the disk noise calculation, the pulse shapes are over-sampled (interpolated between points) and saved in memory. The micro-track method is implemented by random assembling (adding and shifting) to create the final pulse shape. This is repeated uniquely for each pulse.

While the invention has been particularly shown and described with reference to a preferred embodiment thereof, it will be appreciated by those skilled in the art that various other changes in the form and details may be made without departing from the spirit and scope of the invention. It should be understood that this description has been made by way of example, and that the invention is defined by the scope of the following claims.

The invention claimed is:

1. A device for a user to employ in developing and testing disk drive channel electronics, comprising:
   a processor for controlling the device, the processor including a mathematical model of a disk drive system;
   a user interface for the user to communicate with the device, the user interface passing data between the user and the processor;
   a signal generator receiving input signals from the processor relating to the mathematical model and supplying an output signal;
   a noise generator supplying a noise signal in response to input signals from the processor relating to the mathematical model; and
   a summer that sums together the output signal from the signal generator and the noise generator;
   wherein the device outputs an analog signal therefrom for application to the disk drive channel electronics.

2. A testing device as defined in claim 1, wherein the signal generator includes two separate signal generators supplying output signals of substantially the same frequency, and the output signals are interleaved together to create a signal at twice the frequency of the output signals.

3. A testing device as defined in claim 2, wherein output signals from the two signal generators are digital.

4. A testing device as defined in claim 3, wherein analog output signals are created within a first frequency range and analog output signals are created at frequencies lower than the first frequency range by repeating portions of the digital output signals.

5. A testing device as defined in claim 4, wherein the portions of the digital output signals are repeated by storing the output signals in memory in a repetitive fashion.

6. A testing device as defined in claim 4, wherein the portions of the digital output signals are repeated by a counter that repeats the signal a given number of times based on an input signal to the counter.

7. A testing device as defined in claim 1, wherein the noise signal from the noise source is colored.

8. A testing device as defined in claim 7, wherein the amplitude and distribution of the coloration of the noise signal is controlled by the processor based on the mathematical model.

9. A testing device as defined in claim 8, wherein the noise signal is colored by a programmable filter.

10. A testing device as defined in claim 1, further including a power supply that supplies power to the disk drive channel electronics.

11. A testing device as defined in claim 1, further including a thermal asperity generator that supplies a signal to the summer to represent noise generated by thermal asperities in the disk drive system.

12. A testing device as defined in claim 11, wherein the thermal asperity generator supplies an analog signal.

13. A testing device as defined in claim 1, wherein the mathematical model incorporates non-linear transition shift and disk noise phenomena.

14. A testing device as defined in claim 1, wherein the mathematical model provides a series of input signals to the signal generator and the processor stores certain patterns that are repeated often by the mathematical model in a look-up table.

15. A testing device as defined in claim 1, further including an oscilloscope circuit for analyzing signals and providing results to the processor.

16. A testing device as defined in claim 1, wherein the user interface includes a video monitor and a pointing device.

17. A testing device as defined in claim 1, wherein the user interface includes a Windows-based operating system.

18. A testing device as defined in claim 1, wherein the entire device is housed within a PC.

19. A device for a user to employ in developing and testing disk drive channel electronics, comprising:
   a processor for controlling the device;
   a user interface for the user to communicate with the device, the user interface passing data between the user and the processor;
   a pair of signal generators receiving input signals from the processor and supplying digital output signals of substantially the same frequency;
   a digital interleaving circuit receptive of and interleaving together the two digital output signals to generate an interleaved output signal of approximately twice the frequency of the digital output signals;
   a noise generator supplying a noise signal in response to input signals from the processor; and
   a summer that sums together the interleaved output signal and the noise signal;
   wherein the device outputs an analog signal therefrom for application to the disk drive channel electronics.

20. A device for a user to employ in developing and testing disk drive channel electronics, comprising:
   a processor for controlling the device;
   a user interface for the user to communicate with the device, the user interface passing data between the user and the processor;
   a signal generator receiving input signals from the processor and supplying an output signal;
   a colored noise generator supplying a colored noise signal in response to input signals from the processor; and
   a summer that sums together the output signal from the signal generator and the colored noise signal;
   wherein the device outputs an analog signal therefrom for application to the disk drive channel electronics.

21. A device for a user to employ in developing and testing disk drive channel electronics, comprising:
   a processor for controlling the device;
   a user interface for the user to communicate with the device, the user interface passing data between the user and the processor;
   a signal generator receiving input signals from the processor and supplying an output signal;
   a noise generator supplying a noise signal in response to input signals from the processor;
   a thermal asperity generator that supplies a thermal asperity signal to represent noise generated by thermal asperities in the disk drive system; and
   a summer that sums together the output signal from the signal generator, the noise signal, and the thermal asperity signal;
   wherein the device outputs an analog signal therefrom for application to the disk drive channel electronics.

22. A testing device for supplying application-specific test signals for portions of a system under test, the test signals simulating the signals to be generated by the remainder of the system under test, the testing device including:
- a processor for controlling the device, the processor including a mathematical model of a disk drive system;
- a user interface for the user to communicate with the device, the user interface passing data between the user and the processor;
- a signal generator receiving input signals from the processor relating to the mathematical model and supplying an output signal;
- a noise generator supplying a noise signal in response to input signals from the processor relating to the mathematical model; and
- a summer that sums together the output signal from the signal generator and the noise signal;
- wherein the device outputs an analog signal therefrom for application to the portions of the system under test.

23. A device for a user to employ in developing and testing disk drive channel electronics, comprising:
- a PC-based computer, the computer including:
    - a video monitor;
    - at least one input device; and
    - a housing; and
- wherein the housing includes:
    - a processor for controlling the device, the processor including a mathematical model of a disk drive system;
    - a user interface for the user to communicate with the device, the user interface passing data between the user and the processor;
    - a signal generator receiving input signals from the processor relating to the mathematical model and supplying an output signal;
    - a noise generator supplying a noise signal in response to input signals from the processor relating to the mathematical model; and
    - a summer that sums together the output signal from the signal generator and the noise signal;
    - wherein the device outputs an analog signal therefrom for application to the disk drive channel.

* * * * *